United States Patent
Hshieh et al.

(10) Patent No.: US 8,115,252 B2
(45) Date of Patent: Feb. 14, 2012

(54) ELIMINATION OF GATE OXIDE WEAK SPOT IN DEEP TRENCH

(75) Inventors: Fwu-Iuan Hshieh, Saratoga, CA (US); Yee Ai Fai, Ipoh Perak (MY); Ng Yeow Keong, Singapore (SG)

(73) Assignee: M-Mos Sdn.Bhd (MY)

( * ) Notice: Subject to any disclaimer, the term of this patent is extended or adjusted under 35 U.S.C. 154(b) by 0 days.

(21) Appl. No.: 11/127,718

(22) Filed: May 12, 2005

(65) Prior Publication Data
US 2006/0255402 A1    Nov. 16, 2006

(51) Int. Cl.
*H01L 29/78* (2006.01)

(52) U.S. Cl. ............ 257/333; 257/330; 257/E21.429; 438/270

(58) Field of Classification Search ......... 257/330–334; 438/270, 271
See application file for complete search history.

(56) References Cited

U.S. PATENT DOCUMENTS

| | | | | |
|---|---|---|---|---|
| 5,442,214 A * | 8/1995 | Yang | | 257/328 |
| 6,046,487 A * | 4/2000 | Benedict et al. | | 257/510 |
| 6,800,509 B1 * | 10/2004 | Lin et al. | | 438/138 |
| 7,009,247 B2 * | 3/2006 | Darwish | | 257/330 |
| 2002/0117731 A1 * | 8/2002 | Kim et al. | | 257/510 |
| 2002/0167046 A1 * | 11/2002 | Aoki et al. | | 257/330 |
| 2005/0151188 A1 * | 7/2005 | Nakamura | | 257/330 |
| 2005/0215027 A1 * | 9/2005 | Williams et al. | | 438/424 |
| 2005/0287734 A1 * | 12/2005 | Chang et al. | | 438/232 |
| 2006/0205222 A1 * | 9/2006 | In't Zandt et al. | | 438/700 |

* cited by examiner

*Primary Examiner* — Wael Fahmy
*Assistant Examiner* — Abul Kalam
(74) *Attorney, Agent, or Firm* — Bo-In Lin

(57) ABSTRACT

A MOSFET with a 0.7~2.0 micrometers deep trench is formed by first carrying out a processing step of opening a trench in a semiconductor substrate. A thick insulator layer is then deposited in the trench such that the film at the bottom of the trench is much thicker than the sidewall of the trench. The insulator layer at the sidewall is then removed followed by the creation of composite dual layers that form the Gate Oxide. Another embodiment has the insulator layer deposited after Gate Oxide growth and stop at a thin Nitride layer which serves as stop layer during insulator pullback at trench sidewall and during Polysilicon CMP. Embodiments of the present invention eliminates weak spot at trench bottom corner encountered when Gate Oxide is grown in a 0.2 micrometers deep trench with thick bottom oxide. The present invention also maintains good control of the shape of the trench and the thickness profile of the Gate Oxide

12 Claims, 7 Drawing Sheets

ELIMINATION OF GATE OXIDE WEAK SPOT IN DEEP TRENCH

BACKGROUND OF THE INVENTION

1. Field of the Invention

This invention relates generally to the cell structure and fabrication process of semiconductor devices. More particularly, this invention relates to a novel and improved cell structure and improved process for fabricating a trenched semiconductor device, e.g., a trenched power MOSFET device, to eliminate gate oxide weak spot in a deep trench.

2. Description of the Prior Art

For those with ordinary skill in the art of semiconductor manufacture, there is still a technical difficulty in forming a thick oxide layer at the bottom of a trench opened in a semiconductor substrate. Specifically, in the process of forming a thick oxide layer at the bottom of a deep trench with a narrow trench critical dimension (CD), inevitably there are weak spots formed around the corners of the trench bottom. Particularly, these spots are developed at the points where the curvature of the surfaces of the insulator and silicon substrate meet. These weak spots are developed due to the restricted thermal Gate Oxide growth caused by the limited oxygen diffusion into the corner interface between insulator and sidewall substrate.

This technical difficulty often becomes a hindrance to implement a semiconductor device for high switching speed operation. Specifically, the switching speed is a strong function of the capacitance between the gate and the drain generally represented by Crss. In order to reduce the capacitance Crss to increase the switching speed a thick bottom oxide is deposited in the bottom of the trench. By depositing a thicker oxide layer at the bottom of the trench, the capacitance Crss can be reduced to two third or even smaller of the original capacitance without significantly impact to the on-resistance. However, due to the concern of the weak interface spots between the thick oxide bottom layer and the linen layer on the sidewalls, the reliability of semiconductor devices is adversely affected.

In U.S. Pat. No. 6,291,298, Williams et al. disclose a trench gate semiconductor device that has an increased thickness of the gate oxide at the bottom of the trench to diminish the high electric field at the corner of the trench. Different manufacturing processes are employed to increase the thickness of the trench bottom oxide layers. In U.S. Pat. Nos. 6,437,386, 6,573,569, and 6,709,930, several local oxidation of silicon (LOCOS) manufacturing processes are applied to deposit thick oxide layer at the bottom of a trench. However, the layer interfaces disposed near the corner of the trench bottom all have the weak spots that could develop into reliability problems during the life cycles of the device operation.

Referring to FIGS. 1A and 1B for a side cross sectional view and an explosive view respectively of a deep and narrow trench 10. At the bottom of the trench, there is a thick layer of oxide layer 15. The bottom corners 20 of the trench are located at the points where the curvatures of the surfaces of the trench bottom meet the thick oxide layer 15. At these interface points, the gate oxide layer growth is limited due to restricted oxygen diffusion into the corner interface. These weak points often leads to device reliability problems and may further adversely affect the device performance.

Therefore, there is still a need in the art of the semiconductor device fabrication, particularly for trenched power MOSFET design and fabrication, to provide a novel transistor structure and fabrication process that would resolve these difficulties and design limitations.

SUMMARY OF THE PRESENT INVENTION

It is therefore an object of the present invention to provide new and improved processes to open a trench and covering the trench with a thick insulator at the bottom and oxide layer on the sidewalls while eliminating the oxide weak point such that the above discussed technical difficulties may be resolved.

Specifically, it is an object of the present invention to provide a different and novel trench structure and fabrication process for a semiconductor power device wherein the weak spots of the oxide layer is protected by a composite oxide such that the device reliability may be improved by eliminating or reducing the malfunctions caused by the weak spots on the gate oxide.

Another object of the present invention is to provide a different and novel trench structure and fabrication process for a semiconductor power device wherein the deposition of the oxide layer is performed before the deposition of the thick bottom insulator layer. Furthermore, the gate oxide is protected by an etch stop layer to prevent development of oxide weak spots on the oxide layer such that the device reliability may be improved.

Briefly, in a preferred embodiment, the present invention discloses electronic device supported on a semiconductor substrate that includes a trench opened in the semiconductor substrate wherein the trench further includes a thick dielectric layer disposed at a bottom of the trench. The electronic device further includes a composite dual dielectric layers covering a trench side wall and a trench bottom corner interfacing between the trench sidewall and the thick layer of insulation material. In a preferred embodiment, the composite dual dielectric layers include a thermally grown inner oxide layer and a chemically deposited outer oxide layer. In another preferred embodiment, the trench is approximately 0.7 to 2.0 micrometers deep. In a preferred embodiment, the thick dielectric layer on trench bottom has a thickness approximately between 0.1 to 0.3 micrometers. In a preferred embodiment, the composite dual insulation layers on trench sidewall include a thermally grown inner oxide layer of approximately 200 A to 1000 A in thickness and a chemically deposited outer oxide layer of approximately 200 A to 600 A in thickness. In a preferred embodiment, the composite dual dielectric layers include an oxide layer and a nitride outer oxide layer. In a preferred embodiment, the composite dual dielectric layers include an oxide layer and an oxynitride outer oxide layer. In a preferred embodiment, the thick dielectric layer disposed at the bottom of the trench further comprising a local oxidation of silicon (LOCOS) layer. In a preferred embodiment, the thick dielectric layer disposed at the bottom of the trench further comprising a combination of local oxidation of silicon (LOCOS) and oxide layer. In a preferred embodiment, the thick dielectric layer disposed at the bottom of the trench further comprising a combination of deposited oxide layer. In a preferred embodiment, the thick dielectric layer disposed at the bottom of the trench further comprising a combination of deposit oxide and nitride layer.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1A:
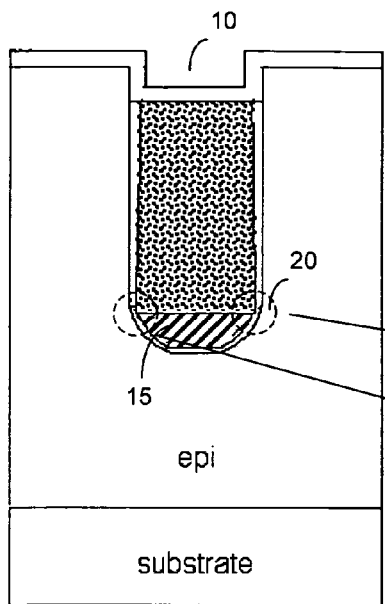
FIGS. 1A and 1B are side cross-sectional view and an explosive view of a trench opened on a semiconductor trench with thick insulator layer at the bottom and weak oxide spots at the bottom corners of the trench.
Figure 1B:
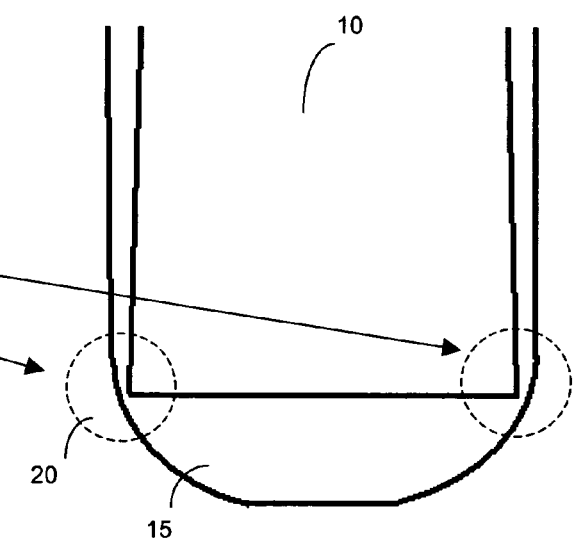
Figure 2:
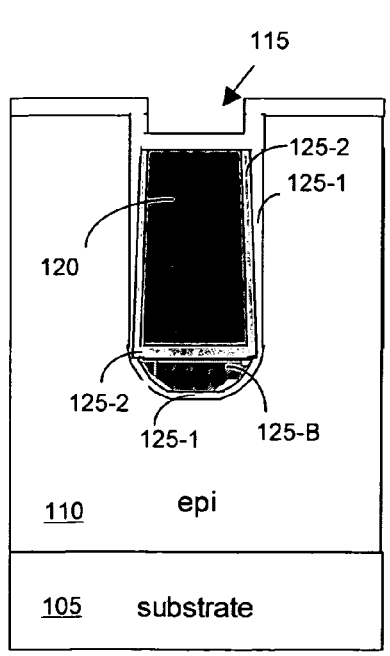
FIG. 2 is a cross sectional view of an improved trench configuration that eliminates oxide weak points by employing a composite dual gate oxide layer.

Please refer to FIG. 2 for a first preferred embodiment of this invention where a semiconductor device 100 is supported on a substrate 105 formed with an epitaxial layer 110. The semiconductor device 100 includes a trench 115 generally filled with polysilicon 120 to function as a gate. For the purpose of eliminating the weak oxide spots, the trenched gate 120 includes a composite dual gate oxide layer 125-1 and 125-2. The first oxide layer 125-1 is first formed for covering the sidewalls and the bottom of the trench 115 with a thick oxide layer 125-B disposed on the bottom of the trench. Then a second oxide layer 125-2 is formed that is disposed on top of the first oxide layer 125-1 and the thick bottom oxide layer 125-B. The second oxide layer 125-2 is formed to fill the weak oxide spots at the corner of the trench bottom. With a dual composite oxide layer, i.e., layers 125-1 and 125-2, the weak spots at the bottom corners of the trench are eliminated.

Figure 3:
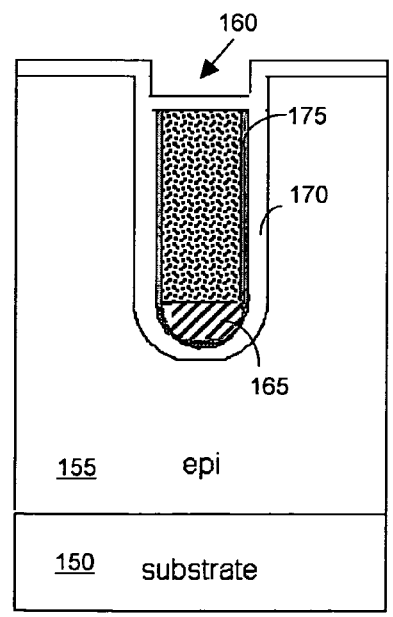
FIG. 3 is a cross sectional view of an improved trench configuration that eliminates oxide weak points by forming a gate oxide layer before the deposition of a thick insulator layer and by protecting the gate oxide layer with a silicon nitride layer.

FIG. 3 shows another trench configuration of this invention that is supported on a substrate 150 with an epitaxial layer 155. The trench 160 includes a thick insulator layer 165 at the bottom of the trench. The trench walls are covered with an oxide layer 170. A thin silicon nitride layer 175 is then formed to cover the oxide layer 170. The silicon nitride layer is deposited before the deposition of the thick insulator layer 165 to serve as a stop layer during the insulator pullback and during the polysilicon and oxide layer CMP process.

As will be further described below, there is a recess of the polysilicon that fills in the trench as shown in FIGS. 2 and 3. The polysilicon is recessed for about 200 to 1000 Angstroms below the substrate for the purpose of growing a screen oxide in order to more conveniently carry out ion implantation steps following the processes performed on the trench as described in the following FIGS. 4 and 5.

Figure 4A:
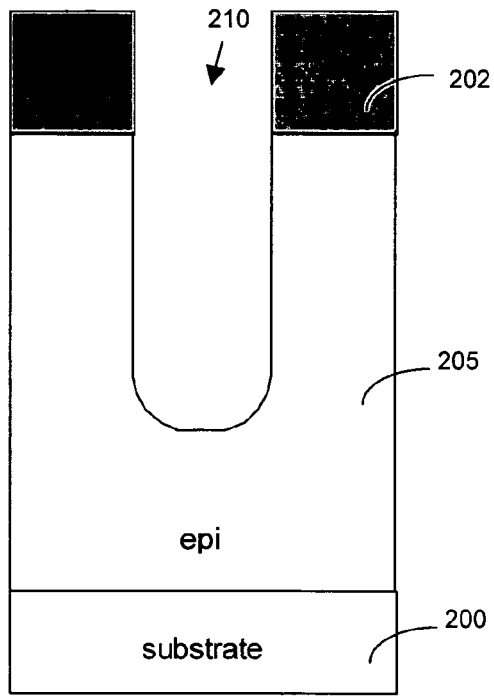
FIGS. 4A to 4K are a serial of side cross sectional views for showing the processing steps for fabricating a semiconductor trench as shown in FIG. 2.
Figure 4B:
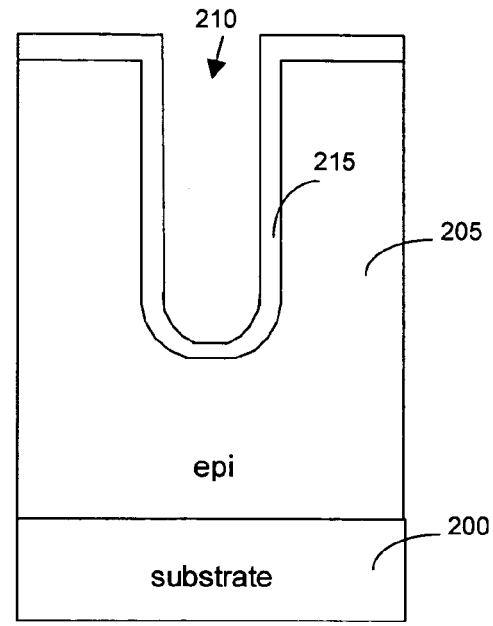
Figure 4C:
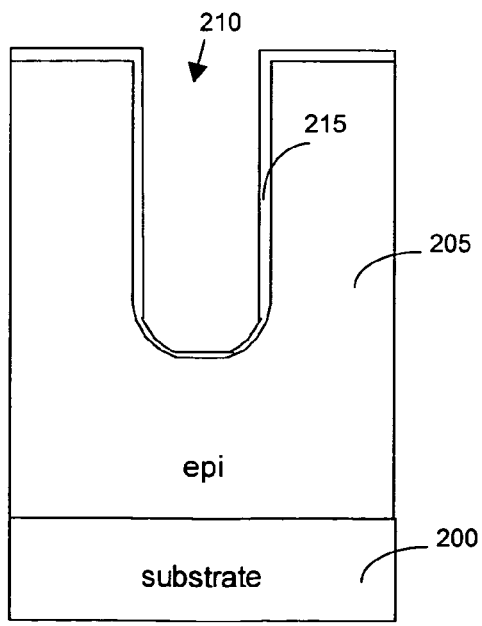
Figure 4D:
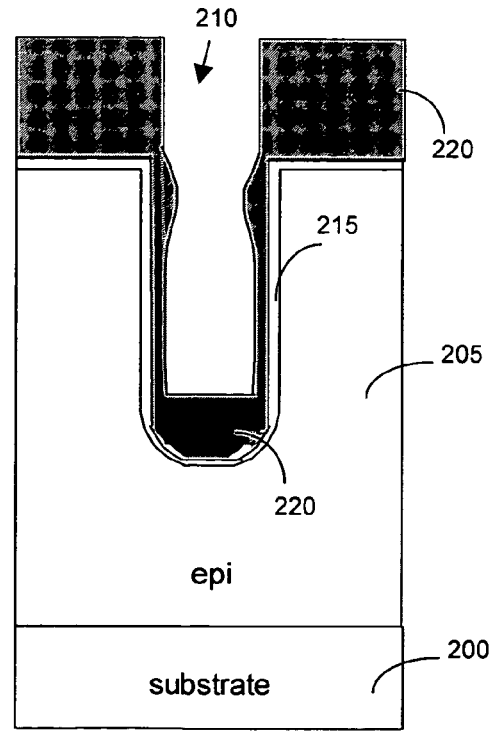
Figure 4E:
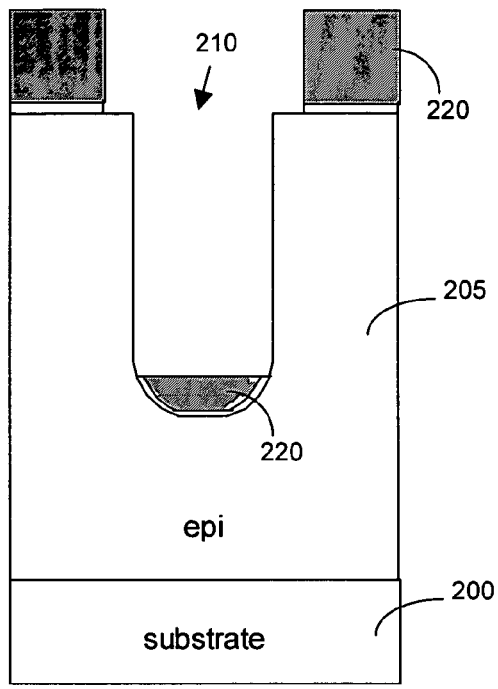
Figure 4F:
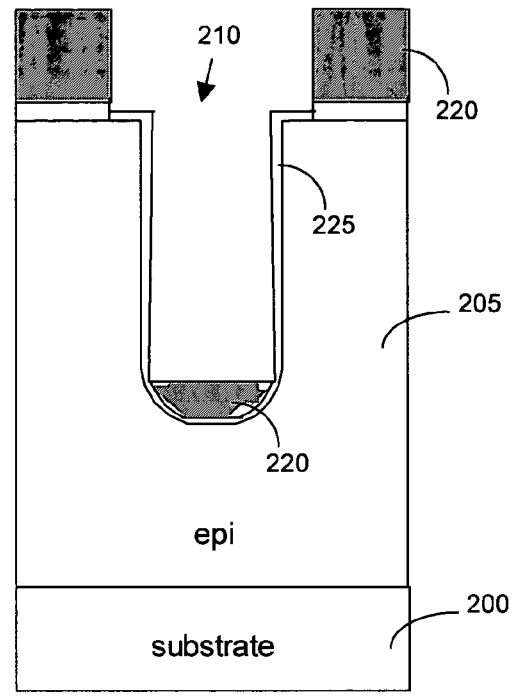
Figure 4G:
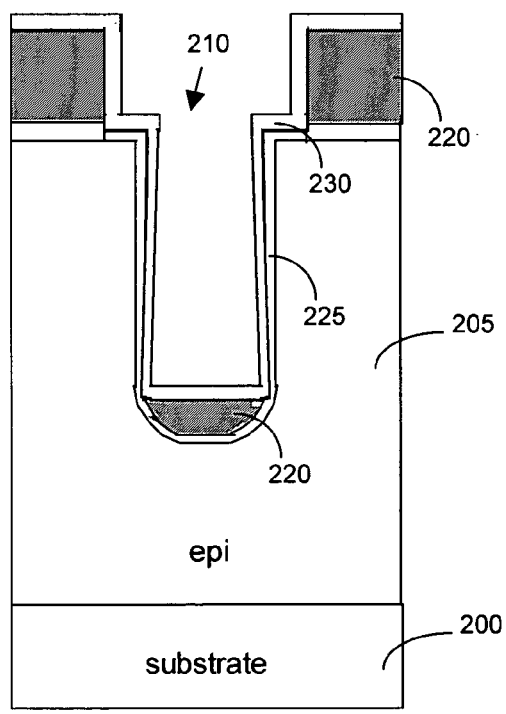
Figure 4H:
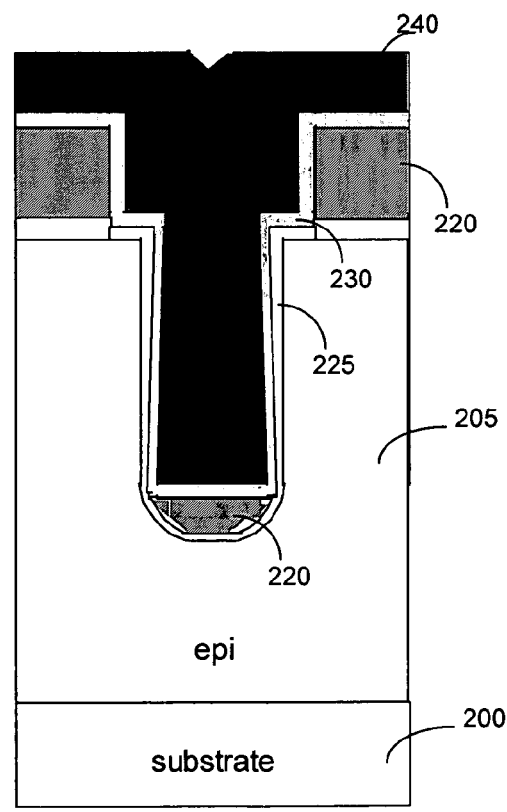
Figure 4I:
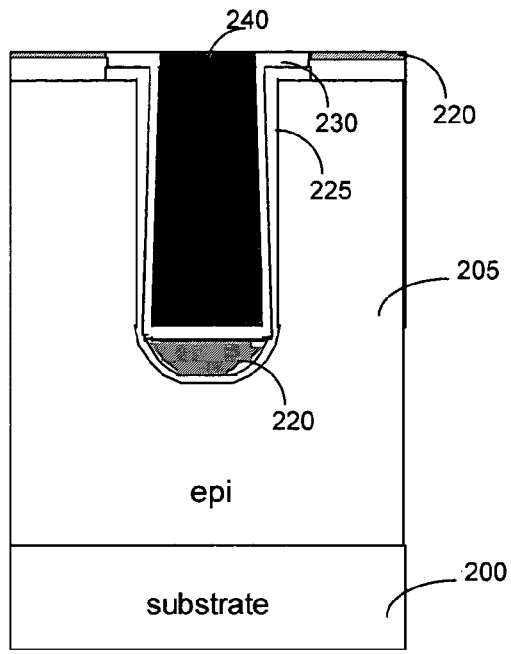
Figure 4J:
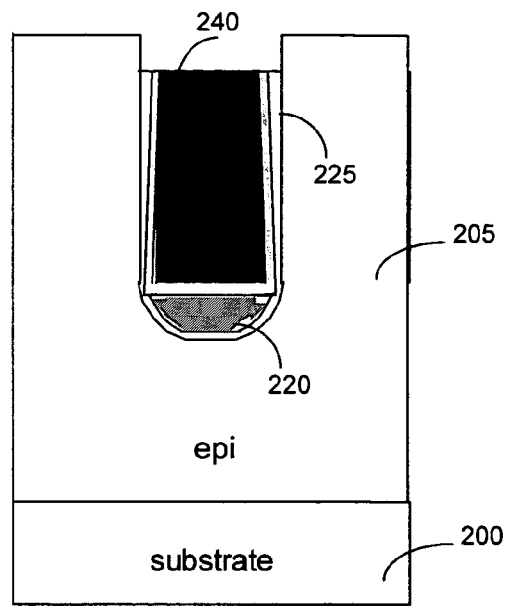
Figure 4K:
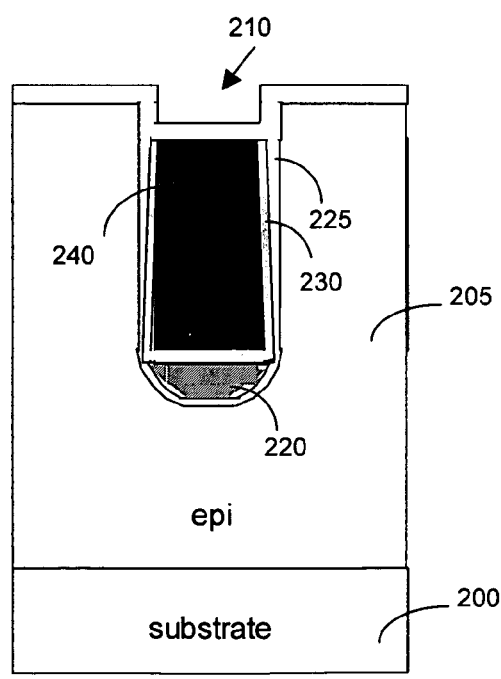

Referring to FIGS. 4A to 4I for a serial of side cross sectional views to illustrate the fabrication steps of a semiconductor device as that shown in FIG. 2. In FIG. 4A, an oxide hard mask 202 is used for opening a trench 210 on an epitaxial layer 205 supported on a substrate 200. In FIG. 4B, the hard mask 202 is removed. An oxidation process is performed to form an oxide layer 215 covering the trench walls. The trench is oxidized with a sacrificial oxide to remove the plasma damaged silicon layer during the process of opening the trench. In FIG. 4C, the sacrificial oxide layer 215 is removed by applying a wet etch process with a partial layer 215 remained as shown. The remaining sacrificial oxide layer is used to protect the trench sidewalls against further damage by sputtering ions during insulator deposition that will be further described below. In FIG. 4D, a thick insulator material 220 is deposited into the trench bottom with much thinner layer deposited at the trench sidewalls. A furnace N2 annealing process is then performed. In FIG. 4E, a wet etch process is carried out to completely remove the sacrificial layer 215 and the insulator layer 220 from the sidewalls of the trench 210. Only the thick layer of insulator layer 220 is left at the bottom of the trench. In FIG. 4F, a thermal oxidation process is carried out to grow a gate oxide layer 225. In FIG. 4G, a second gate oxide layer is deposited by CVD (Chemical Vapor Deposition) furnace to uniformly deposit the second oxide layer 230. The second oxide layer 230 covers and also fills in the weak spots developed at the corners. These weak points are developed at the locations of the interface points between the trench sidewalls and the thick insulator layer where there is a sharp surface curvature. The process continues with a furnace N2 annealing step. In FIG. 4H, a polysilicon 240 is deposited into the trench 210. In FIG. 4I, a chemical-mechanical planarization (CMP) process is performed to polish and remove the polysilicon, the oxide and the insulator from the top of the trench. The top level is about 500 to 1000 Angstroms above the substrate surface. In FIG. 4J, a polysilicon recess is formed that is about 200 to 1000 Angstroms below the substrate by applying a dry etch. The oxide layer in the recess and on top of the substrate is removed by a wet etch and the gate oxide at the trench sidewalls is recessed and flushed with the polysilicon surface to obtain uniform screen oxide for subsequent ion implantation. The non-uniform oxide left after CMP is wet etched. In FIG. 4K, a thermal oxidation is carried out to grow a screen oxide layer 250 for subsequent ion implantation steps.

Figure 5A:
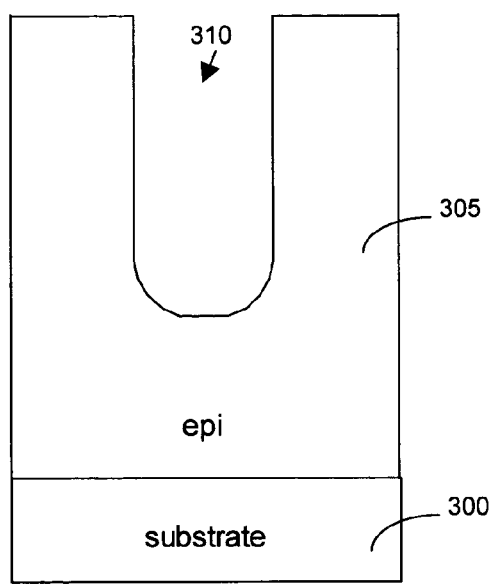
FIGS. 5A to 5I are a serial of side cross sectional views for showing the processing steps for fabricating a semiconductor trench as shown in FIG. 3.
Figure 5B:
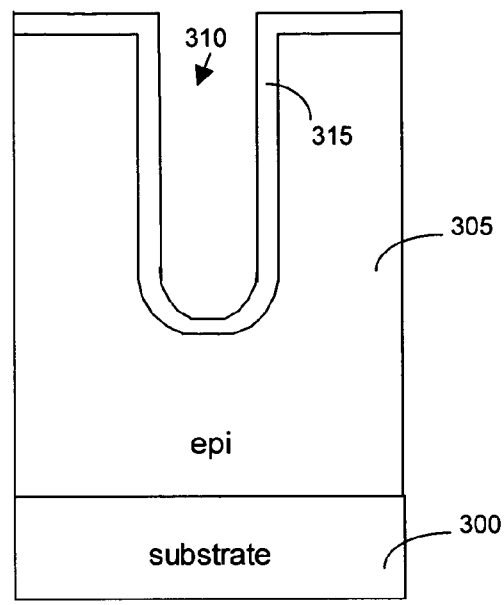
Figure 5C:
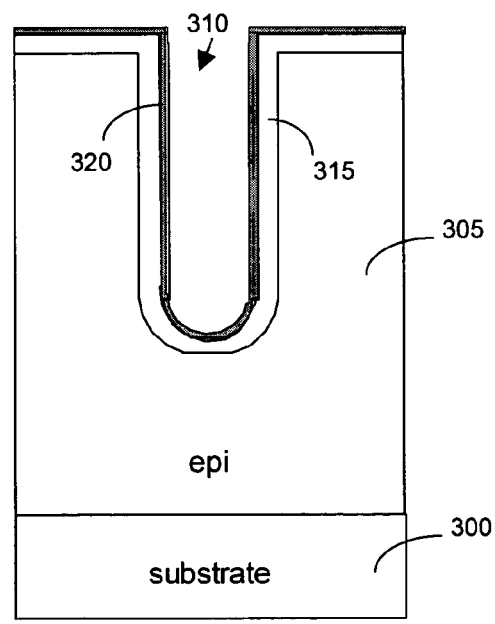
Figure 5D:
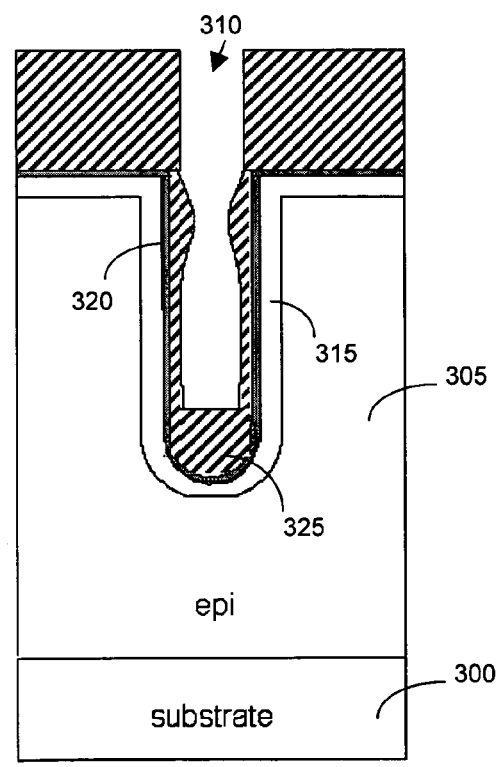
Figure 5E:
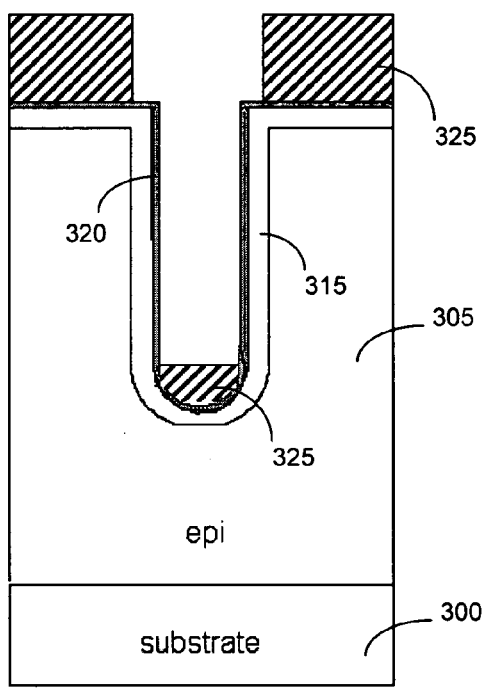
Figure 5F:
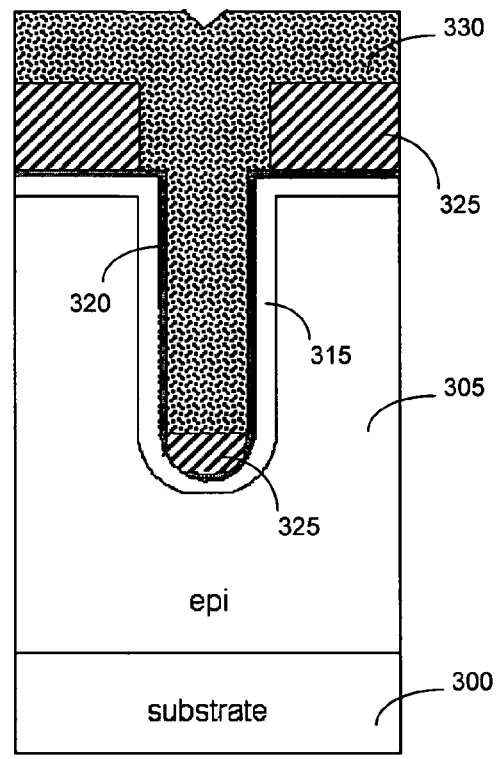
Figure 5G:
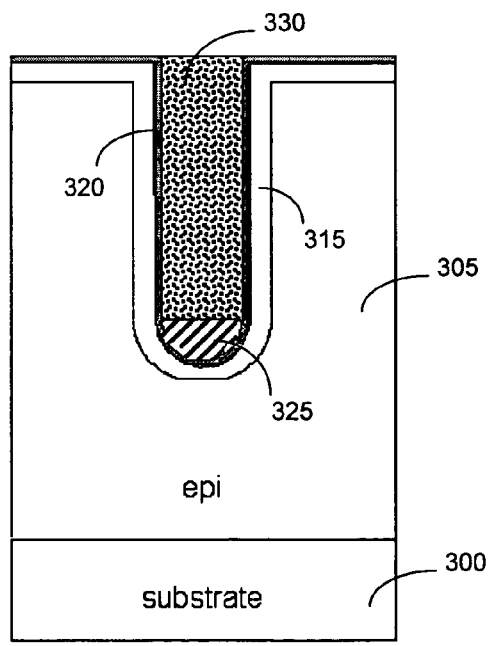
Figure 5H:
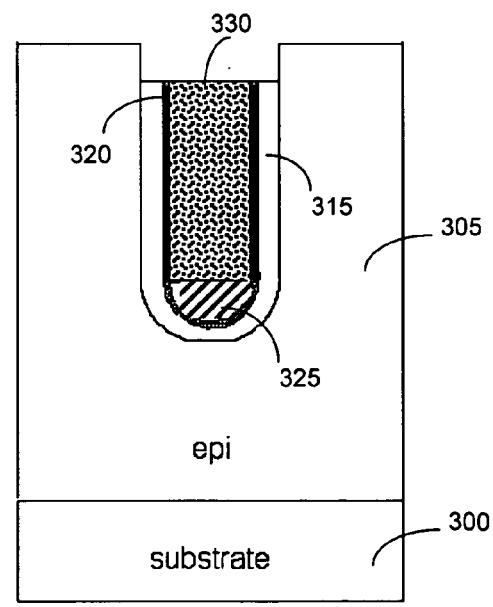
Figure 5I:
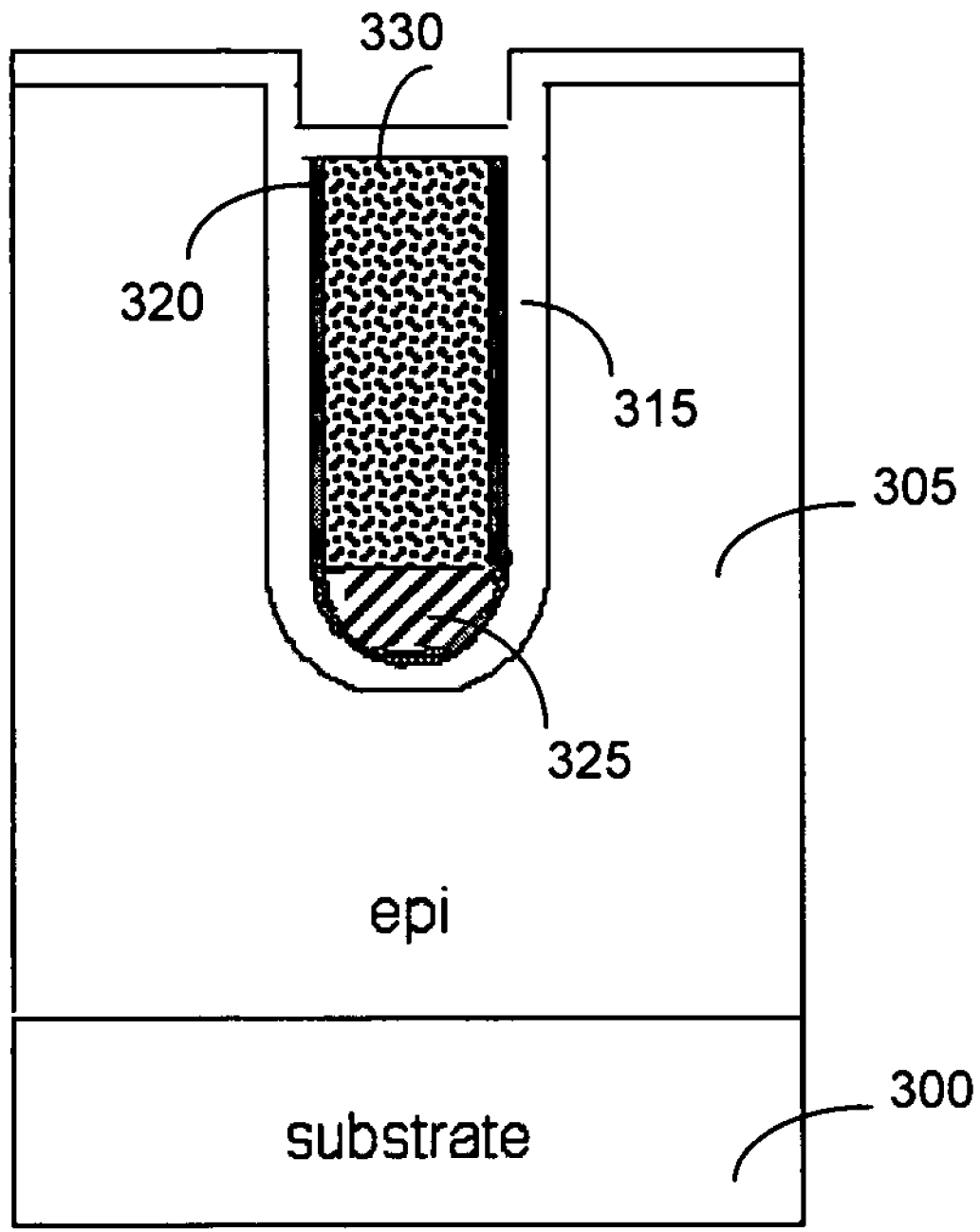

Referring to FIGS. 5A to 5I for the processing steps to fabricate the trench as that shown in FIG. 3. In FIG. 5A, the sacrificial oxide is completed stripped by a wet etch process to remove the plasma damaged silicon layer during the process of opening the trench 310. In FIG. 5B, a gate oxide layer 315 is thermally grown. In FIG. 5C, a thin silicon nitride layer 320 is deposited. In FIG. 3D, a thick insulator layer 325 is deposited onto the trench bottom with a thinner layer deposited at the trench sidewalls followed by a furnace N2 annealing process. In FIG. 5E, a wet etch process is applied to completely remove the insulator layer 325 from the sidewalls of the trench 310. The thick insulator layer 325 is left at the bottom of the trench. In FIG. 5F, the polysilicon 330 is deposited into and fill the trench. In FIG. 5G, a chemical-mechanical planarization (CMP) process is performed to polish and remove the polysilicon, the oxide and the insulator from the top of the trench. The top level is about 500 to 1000 Angstroms above the substrate surface. In FIG. 5H, a polysilicon recess is formed that is about 200 to 1000 Angstroms below the substrate by applying a dry etch. The oxide layer in the recess and on top of the substrate is removed by a wet etch and the gate oxide at the trench sidewalls is recessed and flushed with the polysilicon surface to obtain uniform screen oxide for subsequent ion implantation. The non-uniform oxide left after CMP is wet etched. In FIG. 5I, a thermal oxidation is carried out to grow a screen oxide layer 250 for subsequent ion implantation steps.

According to above descriptions, this invention further discloses a method for manufacturing an electronic device on a semiconductor substrate. The method includes a step of opening a trench in the semiconductor substrate and depositing a thick dielectric layer at a bottom of the trench. The method further includes a step of forming a composite dual dielectric layers for covering a trench side wall and covering a trench bottom corner interfacing between the trench sidewall and the thick layer of insulation material. In a preferred embodiment, the step of forming the composite dual dielectric layers further includes a step of thermally growing an inner oxide layer and chemically depositing an outer oxide layer. In another preferred embodiment, the step of opening the trench further includes a step of opening the trench with approximately 0.7 to 2.0 micrometers in depth. In another preferred embodiment, the step of opening the trench further includes a step of opening the trench with a width substantially narrower than 0.5 micrometers. In another preferred embodiment, the step of opening the trench further includes a step of opening the trench with approximately 0.7 to 2.0 micrometers in depth. And, the step of depositing the thick dielectric layer further on trench bottom includes a step of depositing the dielectric layer of approximately 0.1 to 0.3 micrometers in thickness. In another preferred embodiment, the step of forming the composite dual dielectric layers further on trench sidewall includes a step of thermally growing an inner oxide layer of approximately 0.02 to 0.1 micrometers in thickness and chemically depositing an outer oxide layer of approximately 200 Angstroms to 600 Angstroms in thickness. In another preferred embodiment, the step of forming the composite dual dielectric layers further includes a step of thermally growing an inner oxide layer and chemically depositing an outer nitride layer.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A semiconductor power device supported on a semiconductor substrate comprising:
 a trench gate of said semiconductor power device opened in said semiconductor substrate wherein a bottom surface and sidewalls of said trench gate are covered by a first and a second gate insulation layers wherein said second gate insulation layer covers entirely over said first gate insulation layer and constituting a single stop layer for covering and protecting said first gate insulation layer; and
 a thick dielectric layer disposed at a bottom of said trench gate on top of and surrounded by the second gate insulation layer and said trench gate further comprises a polysilicon layer filling the trench gate on top of the thick dielectric layer wherein said second gate insulation layer covers and protects said first gate insulation layer in a wet etch process performed on said thick dielectric layer.

2. The semiconductor power device of claim 1 wherein:
 said first gate insulation layer comprising a thermally grown oxide layer covering over a bottom surface and lower bottom sidewalls of said trench gate.

3. The semiconductor power device of claim 1 wherein:
 said trench gate is approximately 0.7 to 2.0 micrometers deep opened into said semiconductor substrate.

4. The semiconductor power device of claim 1 wherein:
 said trench gate is less than 0.5 micrometers wide opened in said semiconductor substrate.

5. The semiconductor power device of claim 1 wherein:
 said trench gate is approximately 0.7 to 2.0 micrometers deep opened into said semiconductor substrate and said thick dielectric layer has a thickness approximately between 0.1 to 0.3 micrometers.

6. The semiconductor power device of claim 1 wherein:
 said first gate insulation layer comprising a thermally grown oxide layer of approximately 200 to 1000 Angstroms in thickness and said second gate insulation layer is composed of an etch stop material for entirely covering and protecting said first gate insulation layer.

7. The semiconductor power device of claim 1 wherein:
 said second gate insulation layer comprising a silicon nitride layer covering said first gate insulation layer.

8. The semiconductor power device of claim 1 wherein:
 said second gate insulation layer comprising a silicon oxynitride layer covering said first gate insulation layer.

9. The semiconductor power device of claim 1 wherein:
 said thick dielectric layer disposed at said bottom of said trench further comprising a local oxidation of silicon (LOCOS) layer.

10. The semiconductor power device of claim 1 wherein:
 said thick dielectric layer disposed at said bottom of said trench further comprising a local oxidation of silicon (LOCOS) surrounded by said first gate insulation layer comprising a thermally grown oxide layer covered over by said second gate insulation layer chemically deposited as a silicon nitride layer.

11. The semiconductor power device of claim 1 wherein:
 said thick dielectric layer disposed at said bottom of said trench further comprising a thermally grown thick oxide layer surrounded by said first gate insulation layer covered over by said second gate insulation layer chemically deposited as a silicon nitride layer.

12. The semiconductor power device of claim 1 wherein:
 said thick dielectric layer disposed at said bottom of said trench further comprising a deposited thick oxide layer surrounded by said second gate insulation layer chemically deposited as a silicon nitride layer over said first gate insulation layer.

* * * * *